United States Patent
Chen et al.

(10) Patent No.: US 11,618,671 B2
(45) Date of Patent: Apr. 4, 2023

(54) CHARGE CONTROLLED CLAMP FOR MEMS READOUT CIRCUITS

(71) Applicant: Infineon Technologies AG, Neubiberg (DE)

(72) Inventors: Hong Chen, Villach (AT); Michael Reinhold, Erlangen (DE); Juergen Roeber, Stegaurach (DE); Andreas Wiesbauer, Poertschach (AT)

(73) Assignee: Infineon Technologies AG, Neubiberg (DE)

( * ) Notice: Subject to any disclaimer, the term of this patent is extended or adjusted under 35 U.S.C. 154(b) by 304 days.

(21) Appl. No.: 16/989,187

(22) Filed: Aug. 10, 2020

(65) Prior Publication Data

US 2022/0041431 A1 Feb. 10, 2022

(51) Int. Cl.
*B81B 7/00* (2006.01)
*H02J 50/05* (2016.01)

(52) U.S. Cl.
CPC ............ *B81B 7/007* (2013.01); *B81B 7/0029* (2013.01); *H02J 50/05* (2016.02)

(58) Field of Classification Search
CPC .................................................. B81B 7/0022
See application file for complete search history.

(56) References Cited

U.S. PATENT DOCUMENTS

| 11,235,970 B1 * | 2/2022 | Ng ........................... B81B 7/008 |
| 2014/0327079 A1 * | 11/2014 | Etherton .............. H01L 27/0292 257/355 |
| 2016/0241022 A1 | 8/2016 | Gueorguiev et al. |
| 2017/0284825 A1 * | 10/2017 | Lesso ....................... H04R 3/06 |

* cited by examiner

*Primary Examiner* — Benjamin P Sandvik
(74) *Attorney, Agent, or Firm* — Slater Matsil, LLP

(57) ABSTRACT

A device includes a readout circuit coupled between an input node and an output node; a microelectromechanical systems (MEMS) device coupled to the input node; and a first charge controlled clamp circuit coupled between the input node and a first bias node.

18 Claims, 9 Drawing Sheets

CHARGE CONTROLLED CLAMP FOR MEMS READOUT CIRCUITS

TECHNICAL FIELD

The present invention relates generally to a charge controlled clamp for microelectromechanical systems (MEMS) circuits, and, in particular embodiments, to a corresponding method.

BACKGROUND

The DC operating point of a capacitive MEMS device (i.e., a capacitive MEMS microphone) readout amplifier becomes shifted after an overload condition. Since the input biasing usually has a very low roll-off frequency (in the range of several Hz or several tens Hz for an acoustic application), the disturbed DC operating point can take up to several seconds to recover. System performance becomes severely affected during the settling time, including corrupted sensitivity, increased noise, and increased distortion.

SUMMARY

In accordance with an embodiment of the invention, a device comprises a readout circuit coupled between an input node and an output node; a microelectromechanical systems (MEMS) device coupled to the input node; and a first charge controlled clamp circuit coupled between the input node and a first bias node.

In accordance with another embodiment of the invention, a clamping circuit comprises a first charge controlled clamp coupled between an input node and a first bias node, the first charge controlled clamp being configured to store a first charge associated with the input node during a first voltage clamping mode and to return the first charge to the input node after the first voltage clamping mode; and a second charge controlled clamp coupled between the input node and a second bias node, the second charge controlled clamp being configured to store a second charge associated with the input node during a second voltage clamping mode and to return the second charge to the input node after the second voltage clamping mode.

In accordance with another embodiment of the invention, a method of operating a microelectromechanical systems (MEMS) device comprises clamping a node of the MEMS device to a first voltage during a first overload mode of operation; storing a first charge associated with the node of the MEMS device during the first overload mode of operation; and returning the first charge to the node of the MEMS device after the first overload mode of operation.

In accordance with another embodiment of the invention, a circuit comprises a first capacitor; a first transistor having a load path coupled between the first capacitor and a clamping node; and a first amplifier having a negative input coupled to the clamping node, a positive input coupled to a first clamping voltage reference node, and an output coupled to a control node of the first transistor.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Embodiments of the invention are directed to circuits and methods for quickly restoring the DC operating point of a capacitive MEMS device after an overload condition has ended. In embodiments, the DC operating point is essentially immediately restored after either an AC or DC overload condition has ended. System performance is thus improved by minimizing settling time, improving sensitivity, decreasing noise, and decreasing distortion. In an embodiment of the invention, a method of operating a MEMS device includes clamping a node of the MEMS device to a first voltage during a first overload mode of operation; storing a first charge associated with the node of the MEMS device during the first overload mode of operation; and returning the first charge to the node of the MEMS device after the first overload mode of operation. In other embodiments, circuits for restoring the DC operating point of a capacitive MEMS device after an overload condition include one or more charge controlled clamp circuits, as well as related circuits, and are described in detail below.

Figure 1:
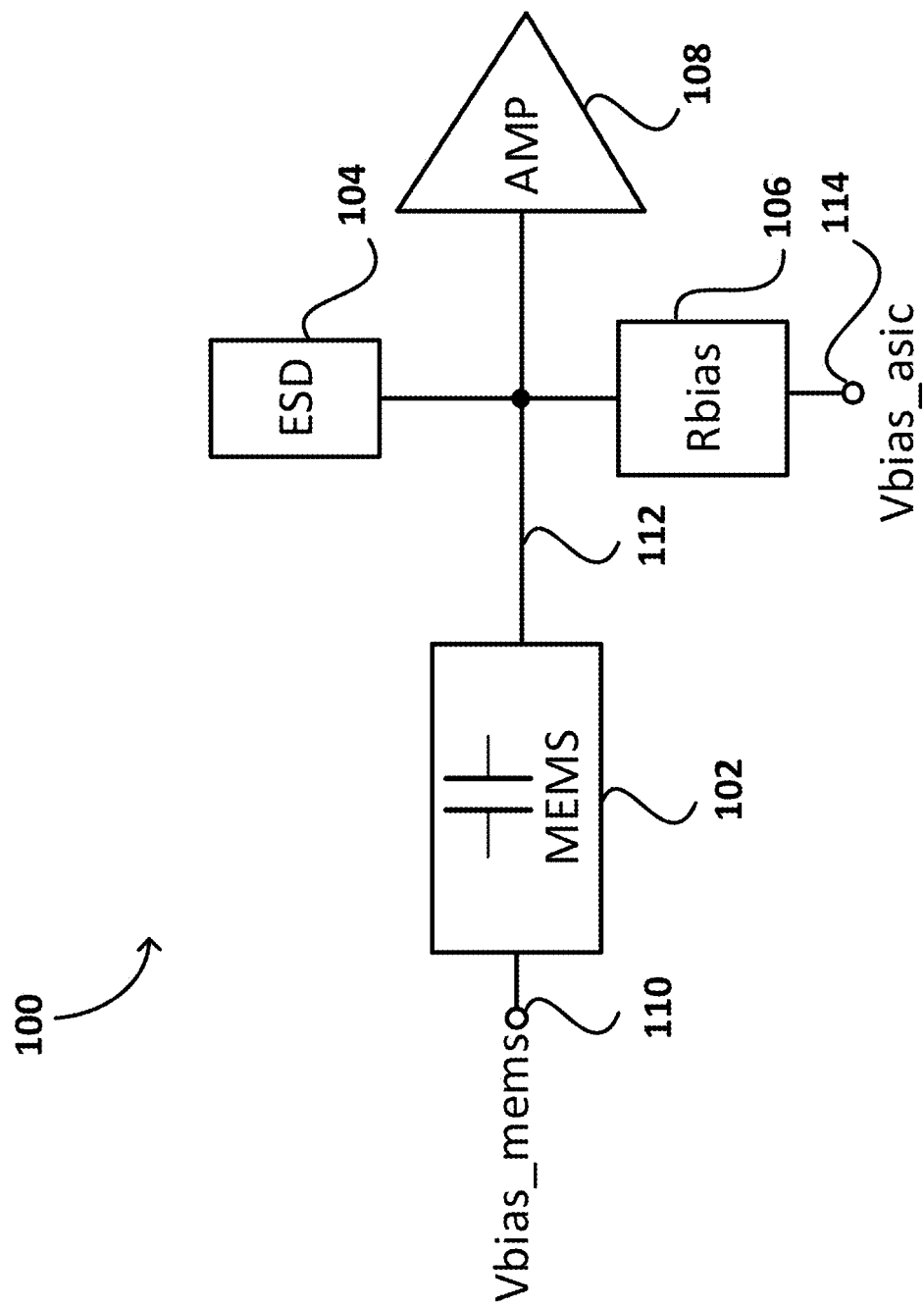
FIG. 1 is a circuit diagram of an exemplary capacitive MEMS readout front-end.

FIG. 1 shows components of an exemplary MEMS readout circuit 100, including a capacitive MEMS device 102 coupled between a bias node 110 designated "Vbias_mems" and circuit node 112, an electrostatic discharge (ESD) protection circuit 104 coupled to circuit node 112, a high value bias resistor 106 coupled between a bias node 114 designated "Vbias_asic" and circuit node 112, and a readout amplifier 108 having an input coupled to circuit node 112.

The bias resistor 106 and ESD protection circuit 104 may be implemented using one or more diodes or diode-connected transistors that can be realized in different implementations. Additionally, at least bias resistor 106 may be implemented using an actual resistor fabricated from a high resistivity material. During high signal level or overload conditions, the bias resistor 106 can start to become leaky, and therefore the capacitor of the MEMS device 102 will lose charge. For extremely high signal overload conditions, there may be an additional charge loss cause by clamping circuits in the ESD protection circuit 104 as well. This additional charge loss can be significant, which causes a DC shift on circuit node 112, and which requires a long settling time for recovering.

A high signal level of an overload condition will cause a corresponding high level AC or DC voltage to appear at the output of the capacitive MEMS device 102 (without clamping). This high level AC or DC voltage will charge up the capacitor of MEMS device 102 coupled to circuit node 112. If the high level AC or DC voltage is clamped, the charge associated with difference in voltage between the peak high level voltage and the clamp voltage will be lost to ground or to a bias voltage associated with the clamping circuitry. The lost charge will correspondingly result in the DC voltage shift on circuit node 112 that is best seen in waveform 904 in FIG. 2B occurring at 20 ms. The DC shift on circuit node 112 can last for a long time as is shown in FIG. 2B, which has not resolved at 50 ms. The DC shift on circuit node is finally restored to the original DC operating point after a long period of time once the capacitance inside of capacitive MEMS device 102 is charged back up to replace the has expired lost charge through circuit components such as ESD protection circuit 104 coupled to circuit node 112. FIG. 2B addresses a solution to the DC voltage shift according to embodiments of the present invention and is described in further detail below.

The DC operating point shift of readout circuit 100 can be prevented by storing the charge lost at circuit node 112 during clamping, and returning the stored charge back to circuit node 112 after clamping. A charge controlled clamping circuit using one or more charge controlled clamps according to embodiments can be used to both voltage clamp circuit node 112, to store the charge lost at circuit node 112 during clamping, and to return the stored charge back to circuit node after clamping. A charge controlled clamping circuit for a MEMS readout front-end is shown in FIG. 2A, according to an embodiment, and described in detail below.

Figure 2A:
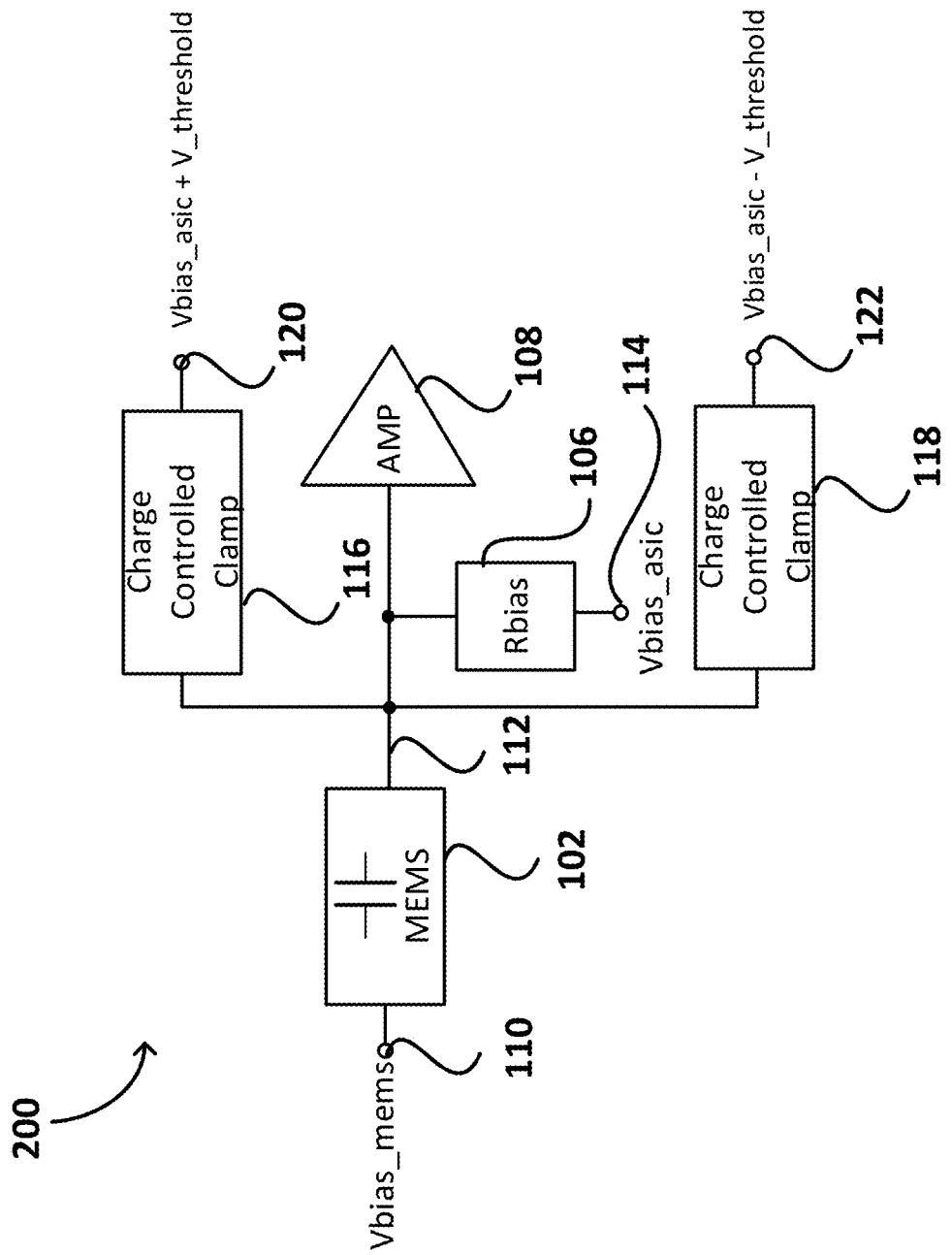
FIG. 2A is a circuit diagram of a charge controlled clamp circuit for a MEMS readout front-end according to an embodiment.
Figure 2B:
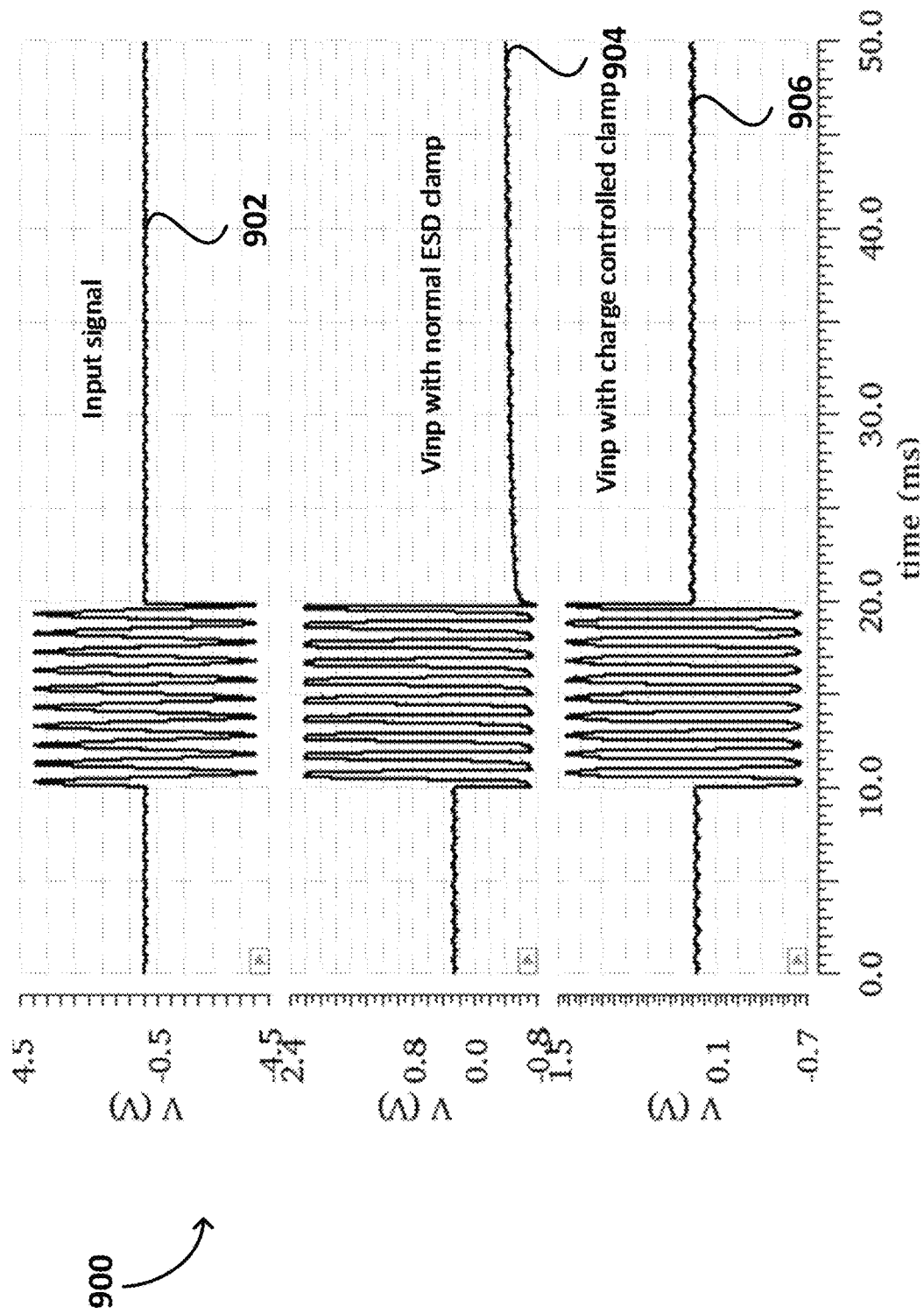
FIG. 2B is a timing diagram comparing the response of the circuit of FIG. 1 and the circuit of FIG. 2A.

FIG. 2A is a circuit diagram of a charge controlled clamp circuit for a MEMS readout circuit 200 according to an embodiment. MEMS readout circuit 200 includes MEMS device 102, bias resistor 106, and readout amplifier 108 as previously described in FIG. 1, ESD protection circuit 104 has been removed, and charge controlled clamp 116 and charge controlled clamp 118 have been added, according to an embodiment. Charge controlled clamp 116 is coupled between a bias node 120 designated "Vbias_asic+V_threshold" and circuit node 112. Charge controlled clamp 118 is coupled between a second bias node 122 designated "Vbias_asic−V_threshold" and circuit node 112. Circuit node 112 is an output node with respect to MEMS device 102, but is also an input node with respect to readout amplifier 108, and charge controlled clamp 116 and charge controlled clamp 118. Embodiments of the charge controlled clamp 116 and the charge controlled clamp 118 are described in detail below.

MEMS device 102 may comprise a microphone, although other types of MEMS devices can be used. An overload condition can occur at circuit node 112 if the input to the MEMS device is exposed to a high level acoustic source resulting in a large AC voltage at circuit node 112. Once the high level acoustic source is turned off, the large AC voltage at circuit node returns to a normal level as the overload condition is removed. An overload condition can also occur at circuit node 112 if the input of the MEMS device is exposed to environmental hazards such as dust or other environmental factors resulting in a large AC or DC voltage at circuit node 112. Once the environmental exposure is ended or resolved, the large AC or DC voltage at circuit node returns to a normal level as the overload condition is removed.

In readout circuit 200, after an overload condition is removed, the DC operating point will immediately be restored (within a few milliseconds) since the charge associated with the overload condition stored in charge controlled clamp 116 and charge controlled clamp 118 is immediately and completely restored to circuit node 112. Therefore, very little or essentially no settling time is required to restore normal operation.

FIG. 2B is a timing diagram 900 comparing the response of the circuit of FIG. 1 using conventional ESD clamps and the circuit of FIG. 2A, which uses charge controlled clamps according to an embodiment. Waveform 902 represents the input signal to the charge controlled clamping circuits at circuit node 112, which is also the output of the MEMS device 102. Waveform 902 includes an AC overload condition that occurs between 10 ms and 20 ms that extends between −4.5 volts and +4.5 volts (unclamped). Waveform 904 represents the response of readout circuit 100 at circuit node 112 (Vinp). The overload condition is clamped between −0.8 volts and 2.4 volts from 10 ms to 20 ms using the conventional ESD clamping circuits, however the DC operating point has been lowered and does not recover between 20 ms and 50 ms after the overload condition is removed. Waveform 906 represents the response of readout circuit 200 at circuit node 112 (Vinp). The voltage at circuit node 112 is clamped between −0.7 volts (for negative peaks of an AC overload condition) and 1.5 volts (for positive peaks of an AC overload condition) from 10 ms to 20 ms using the charge controlled clamps 118 and 116 described herein, however the DC operating point has not been lowered and fully recovers to the original DC operating point almost immediately.

Figure 3:
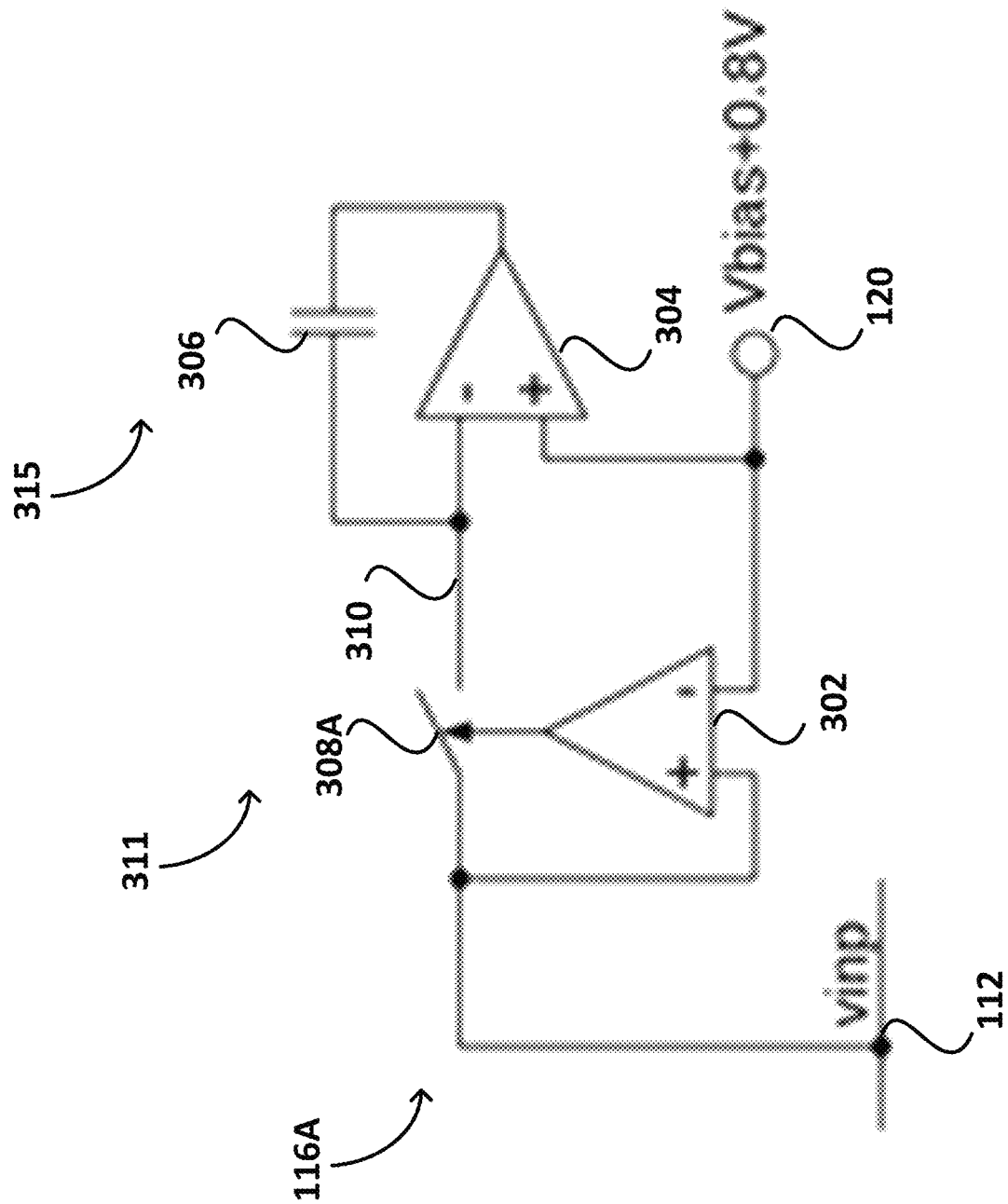
FIG. 3 is a circuit diagram of an embodiment of a charge controlled clamp.

FIG. 3 is a schematic diagram of an embodiment of a charge controlled clamp 116A corresponding to charge controlled clamp 116 shown in FIG. 2A. FIG. 3 can also serve as a schematic diagram of the charge controlled clamp 118 shown in FIG. 2A except that the bias voltage would be changed to "Vbias−0.8V". Circuit node 112 is designated "vinp" as being the input node of the readout amplifier, as well as being associated with a positive clamp voltage. The charge controlled clamp 116A comprises here a regulated switch 311 and an integrator 315 for charge storage. Regulated switch 311 includes an operational amplifier 302 having a positive input coupled to circuit node 112, a negative input coupled to bias node 120 designated "Vbias+0.8V" in the embodiment of FIG. 3. The integrator 315 includes an operational amplifier 304 having a positive input coupled to bias node 120. A capacitor 306 is coupled between the negative input and the output of operational amplifier 304.

In operation, switch 308A is open in an initial condition. Charge from circuit node 112 (designated "vinp" as the input voltage to charge controlled clamp 116A in FIG. 3) is stored on capacitor 306 when the vinp voltage is above Vbias+0.8V, the charge flowing through closed switch 308A. When the overload condition is removed and the input voltage vinp begins to fall, charge is returned to circuit node 112 through closed switch 308A. When the vinp voltage at circuit node 112 returns to the initial voltage, switch 308A is opened.

For example, if Vbias is equal to 0.2V, then a voltage at circuit node 112 before the overload condition will be less than one volt and will cause switch 308A to be open (off). This is because the positive input of operational amplifier 302 is less than the negative input and the output of operational will be forced to a low voltage that is applied to the control terminal of switch 308A, turning off the switch. An AC voltage at circuit node 112 during the overload condition will have peaks tending towards a voltage greater than one volt, but these peaks will be clamped at or near the clamp voltage of one volt. Switch 308A will be closed (on) during these peaks since the positive input of operational amplifier 302 is greater than the negative input and the output of operational will be forced to a high voltage that is applied to the control terminal of switch 308A, turning on the switch. The integrator 315 is used to store all of the charge flowing through switch 308A into capacitor 306. In the integrator configuration, integrator 315 has a positive input coupled to bias node 120, a negative input that will also assume the voltage (one volt, in this case) on the positive input, and an output that will assume a voltage necessary to adjust to the amount of charge flowing into capacitor 306. The charge will be continuously stored on the capacitor 306 when the AC voltage at node 112 keeps rising beyond the clamp voltage (one volt in this case). The charge will be continuously returned to MEMS capacitor through node 112 when the AC voltage at node 112 starts falling towards the clamp voltage (one volt, in this case). When the AC voltage at node 112 continues to fall below the clamp voltage (one volt, in this case), which means the overload condition is gone, switch 308 will be open (off) since the positive input of operational amplifier 302 is less than the negative input and the output of operational will be forced to a low voltage that is applied to the control terminal of switch 308A, turning off the switch.

Figure 4:
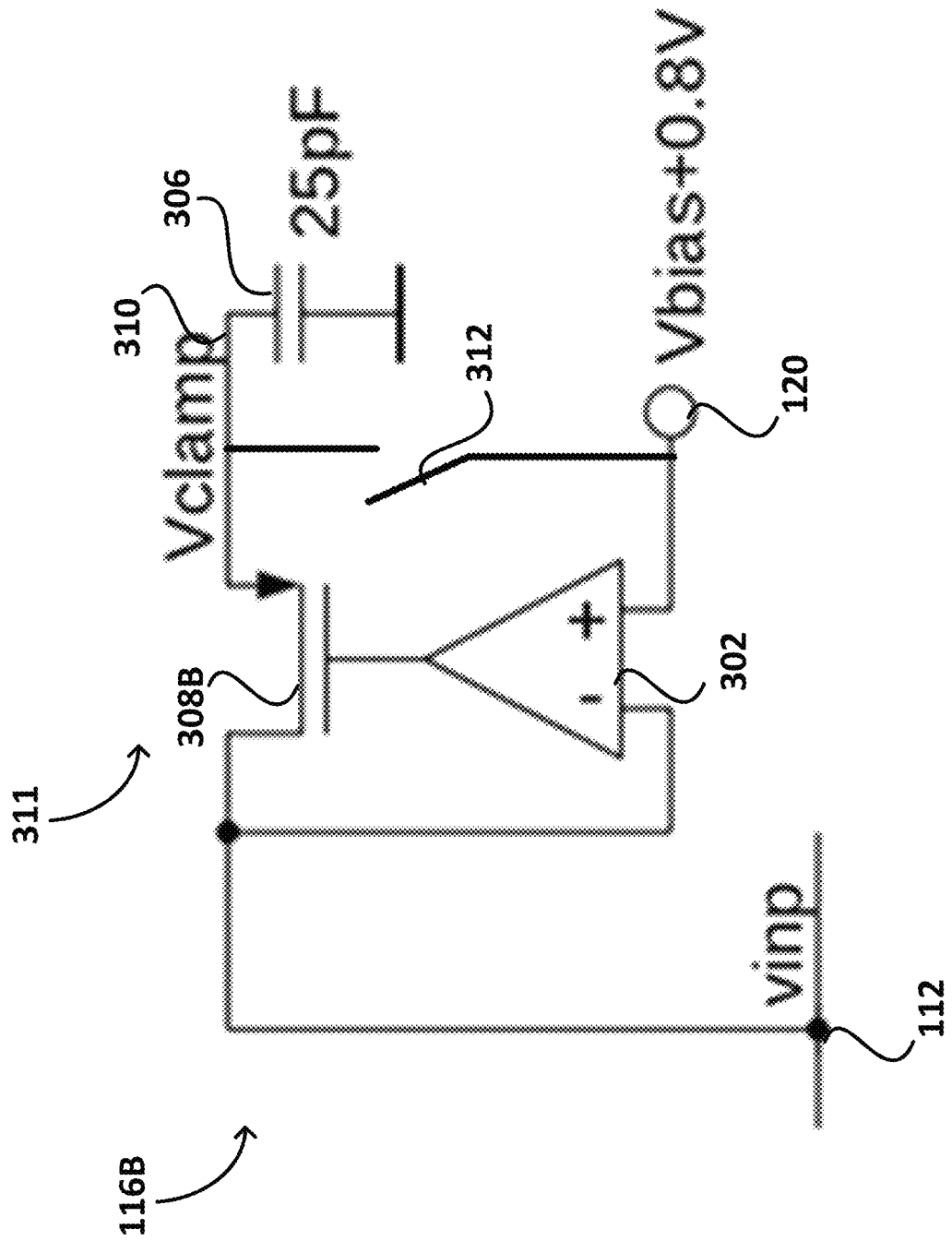
FIG. 4 is a circuit diagram of an embodiment of a charge controlled clamp including a single transistor regulated switch.

FIG. 4 is a circuit diagram of an embodiment of a charge controlled clamp 116B including a single transistor regulated switch embodiment, and the integrator 315 is replaced by a single capacitor 306. The single capacitor implementation can effectively replace the integrator 315 shown in FIG. 3 if capacitor 306 is a large enough capacitor (larger than the MEMS device capacitor and up to 15 times larger or more than the MEMS device capacitor) is used to store the charge on circuit node 112. In an embodiment, the value of capacitor 306 is shown to be 25 pF, although other values can be used in embodiments. Also shown in FIG. 4 is pre-charge switch 312 for pre-charging the voltage on capacitor 306 to the DC operating voltage of circuit node 120. Pre-charge switch 312 can be implemented as a transistor having a gate energized by a pre-charge control signal (not shown in FIG. 4). The regulated switch 311 in FIG. 4 continues to use operational amplifier 302 shown in FIG. 3, but switch 308A is replaced by P-channel transistor 308B having a drain coupled to circuit node 112, a source coupled to circuit node 310 designated "Vclamp" and a gate coupled to the output of operational amplifier 302.

In operation, charge controlled clamp 116B is similar to that of charge controlled clamp 116A, except that charge is transferred from and to capacitor 306 through transistor 308B configured as a switch. Before the overload condition, transistor 308B is turned off, during the overload condition transistor 308B is selectively turned on (assuming an AC overload condition), and after the overload condition has ended transistor 308B is turned off as previously discussed with respect to switch 308A shown in FIG. 3. Before an overload condition, for example at the beginning of an operational cycle, pre-charge switch 312 can be opened, and then closed to equalize the voltages between bias node 120 and capacitor node 310. In this manner, the voltage on capacitor 306 will be pre-charged to the clamp voltage. Thus an accurate amount of charge lost during the clamping of circuit node 112 will be stored on capacitor 306 since the reference voltage of capacitor 306 is equal to the clamping voltage. Pre-charge switch 312 can be turned off after the voltage on bias node (Vbias+0.8V) is equal to the voltage on capacitor node 310. The control node of pre-charge switch 312 can be controlled by a microprocessor (not shown in FIG. 4) integrated into the same integrated circuit as readout circuit 200 shown in FIG. 2A, or can be controlled by a signal generated external to the integrated circuit.

Figure 5:
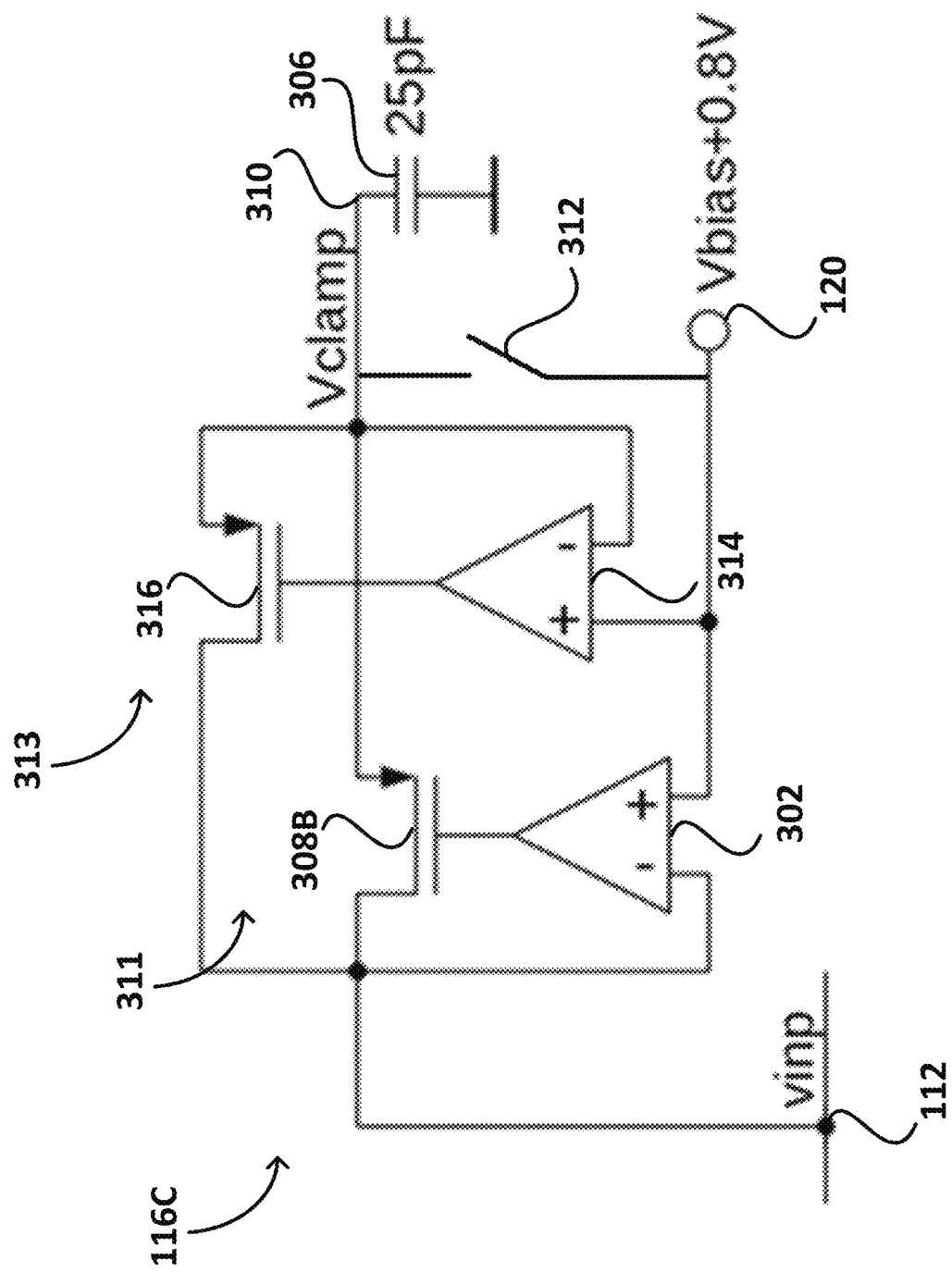
FIG. 5 is a circuit diagram of an embodiment of a charge controlled clamp including a first transistor regulated switch and a second transistor regulated switch.

FIG. 5 is a circuit diagram of an embodiment of a charge controlled clamp 116C including a first and second regulated switches. All of the circuit components of charge controlled clamp 116C are the same as shown for charge controlled clamp 116B of FIG. 4, except that an additional regulated switch 313 is included to improve the performance of the charge controlled clamp 116C. Regulated switch 313 includes a second operational amplifier 314 having a positive input coupled to bias node 120, a negative input coupled to Vclamp circuit node 310, and an output coupled to the gate of P-channel transistor 316. The drain of transistor 316 is coupled to circuit node 112, and the source of transistor 316 is coupled to the Vclamp circuit node 310.

In operation, regulated switch 313 provides a second path for charge to flow to and from capacitor 306. In some situations, any residual charge on capacitor 306 after the overload condition is removed may be able to be completely transferred to circuit node 112 through transistor 316. The reason for this is that regulated switches 311 and 313 each include operational amplifiers having negative inputs referenced to two different circuit path nodes of transistor 308B. Note that regulated switch 311 includes an operational amplifier 302 having inputs referenced to the drain of transistor 308B (circuit node 112) and to the bias node 120. In contrast regulated switch 313 includes an operational amplifier 313 having inputs referenced to the source of transistor 308B (capacitor node 310) and to the bias node 120. In this manner, the voltages at both the source and drain of transistor 308B are monitored and regulated when compared to the voltage at bias node 120.

Figure 6:
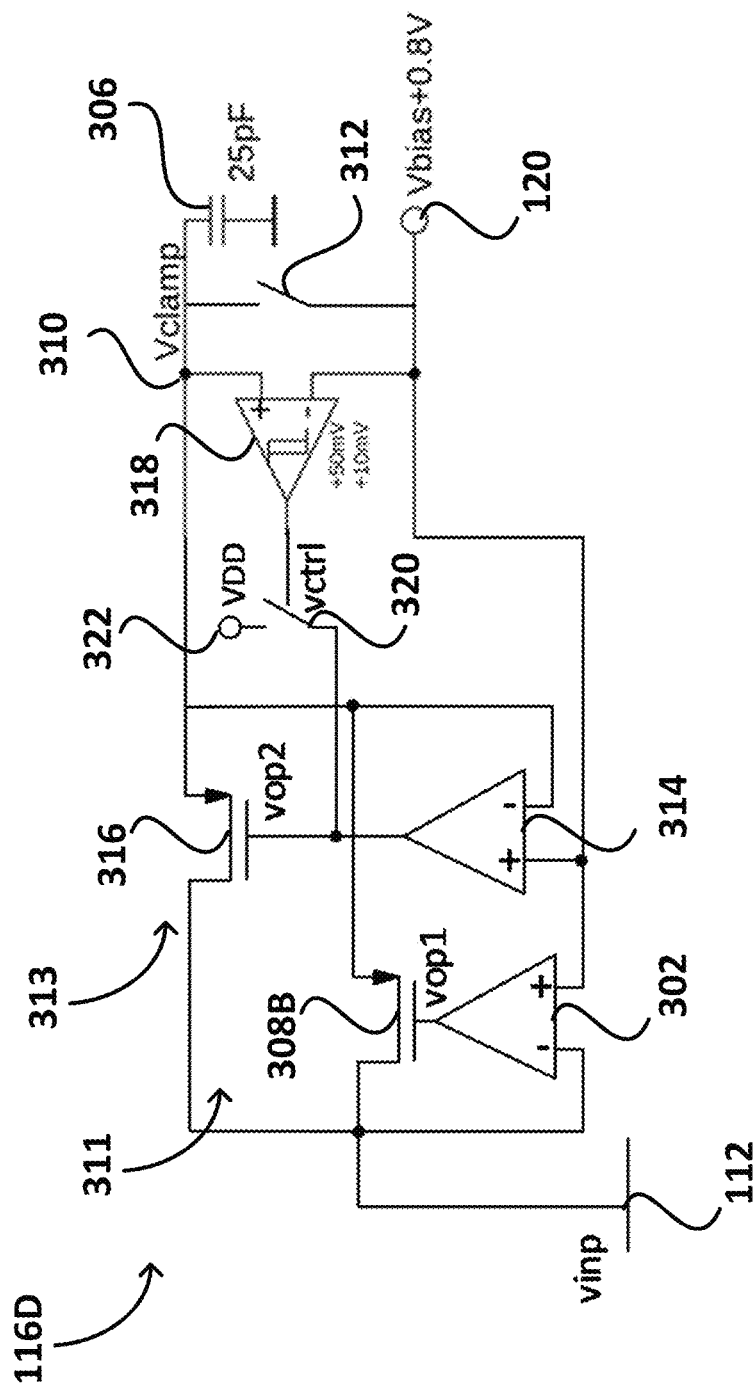
FIG. 6 is a circuit diagram of an embodiment of a charge controlled clamp including first and second regulated switches, as well as a Schmitt trigger circuit for controlling the operation of the second regulated switch.

FIG. 6 is a circuit diagram of an embodiment of a charge controlled clamp 116D similar to charge controlled clamp 116C shown in FIG. 5, except that a Schmitt trigger circuit 318 and a switch 320 has been added to control the operation of the second regulated switch 313. Also, the voltage at the gate of transistor 308B has been labeled "vop1" and the voltage at the gate of transistor 316 has been labeled "vop2" to further illustrate the operation of charge controlled clamp 116D in the timing diagram of FIG. 7, which is described below. In an embodiment, Schmitt trigger circuit 318 includes a positive input coupled to the Vclamp circuit node 310, a negative input coupled to bias node 120, and an output for providing the "vctrl" control signal for controlling the operation of switch 320. Switch 320 is coupled between VDD at circuit node 322 and the gate of transistor 316, which is the vop2 voltage. Schmitt trigger circuit 318 has a hysteresis of about 40 mV in an embodiment, wherein a differential input voltage greater than 50 mV switches the output of the Schmitt trigger circuit to a logic one, and wherein a differential input voltage less than 10 mV switches the output of the Schmitt trigger circuit to a logic zero.

In operation, the Schmitt trigger circuit 318 is used for safely turning off regulated the second regulated switch 316, which is explained below in conjunction with the timing diagram of FIG. 7.

Figure 7:
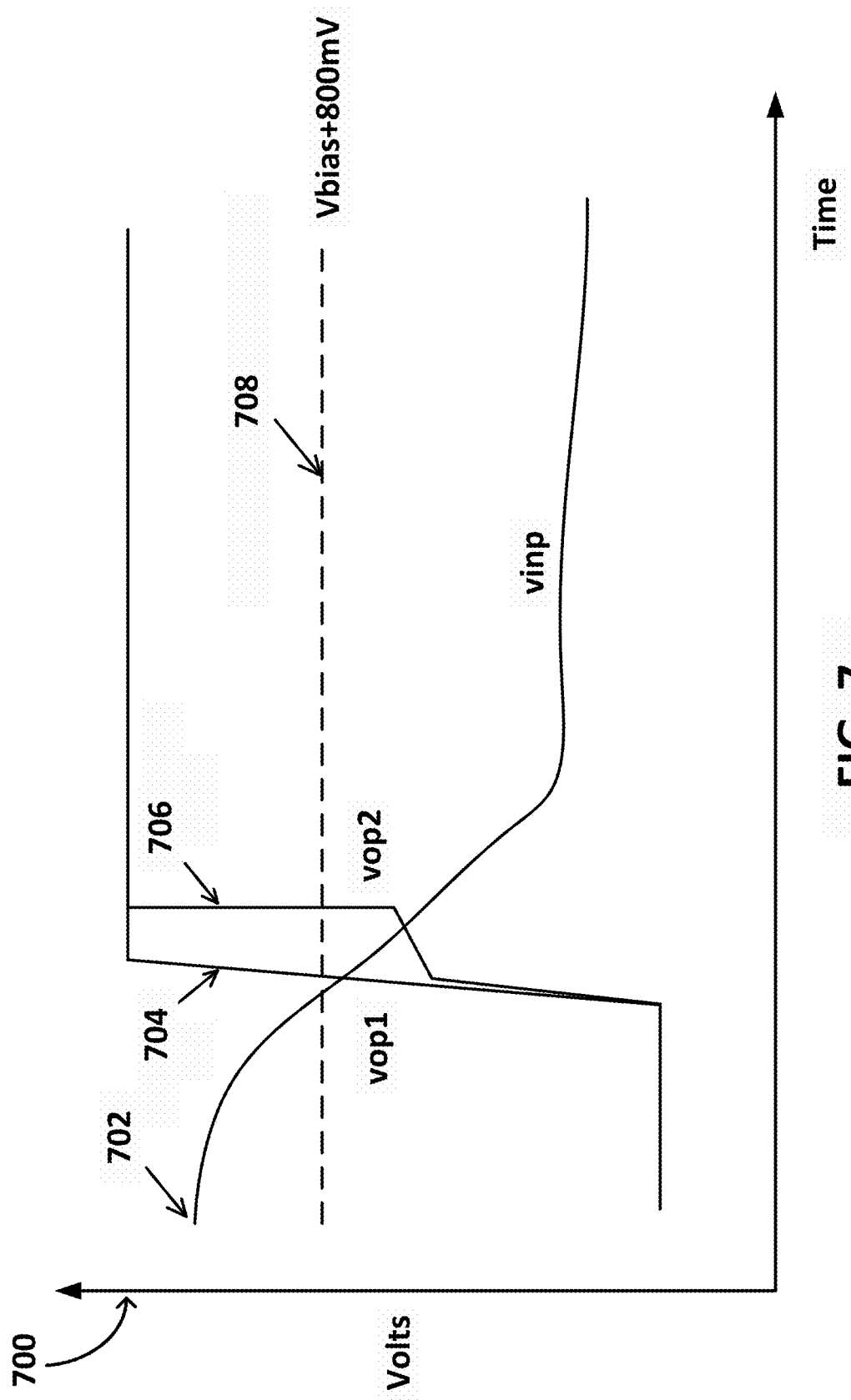
FIG. 7 is a timing diagram associated with the charge controlled clamp of FIG. 6.

FIG. 7 shows the timing diagram 700 of charge controlled clamp 116D shown in FIG. 6. Timing diagram 700 includes waveform 702, which is the vinp voltage at circuit node 120; waveform 704, which is the vop1 voltage at the gate of transistor 308B; waveform 706, which is the vop2 voltage at the gate of transistor 316; and waveform 708, which is the bias voltage of Vbias+800 mV at bias node 120. In operation, when the value of vinp decreases from a high value in the positive overload condition into a lower value in the normal operation range, the first operational amplifier loop (first regulated switch 311) is turned off by voltage vop1 rising first as is shown by waveform 704. However, since the discharging through the first loop of regulated switch 311 may not be fast enough, a delaying mechanism using Schmitt trigger circuit 318 is designed in the second operational amplifier loop (second regulated switch 313) such that the vop2 voltage rises later than the vop1 voltage, which can be seen in the comparison of corresponding waveforms 704 and 706. Thus, the storage capacitor 306 can be sufficiently discharged and the initial condition at circuit node 112 can be fully restored without any residue error. While specific hysteresis voltages are shown in FIG. 7, other hysteresis levels can be used for a specific application. Apart from the delay mechanism, which helps to fully restore the charge at node 112, the switch 320 also helps to switch off transistor 316 safely due to the following reasons. Transistor 316 will not be turned off completely solely by the action of operational amplifier 314 via node vop2, even if voltage on node 310 falls below the clamping voltage (vbias+0.8V in this case). In order to toggle the node vop2 from low (during overload) to high (after overload is gone), the voltage at node 310 has to be sufficiently smaller than the voltage at node 120 due to the limited dynamic range of operational amplifier 314. But, as soon as voltage at node 310 drops slightly below voltage at node 120, operational amplifier 314 starts to react in a weak manner, such that voltage at node vop2 rises to a value high enough to turn off PMOS transistor 316, but not safely high (VDD). In such a condition, the voltage at node 310 is at a value not sufficiently smaller than voltage at node 120, such that vop2 can never, or takes very long time to, reach VDD. To summarize, with the help of the Schmitt trigger 318 and switch 320, transistor 316 can be turned off safely with the necessary delay.

FIGS. 3, 4, 5, and 6 illustrate examples of charge controlled clamps that can be used for the charge controlled clamp 116 shown in FIG. 2A. In embodiments, a bias voltage of Vbias+0.8V is used with these charge controlled clamps. In FIG. 2A, a charge controlled clamp 118 is shown, associated with a different bias voltage. In embodiments, a bias voltage of Vbias−0.8V is used with the charge controlled clamp 118. The circuits shown in FIGS. 3, 4, 5, and 6 can be used for charge controlled clamp 118, but with the exception that the bias voltage should be changed to a lower bias voltage. In embodiments, this bias voltage can be Vbias−0.8V.

Figure 8:
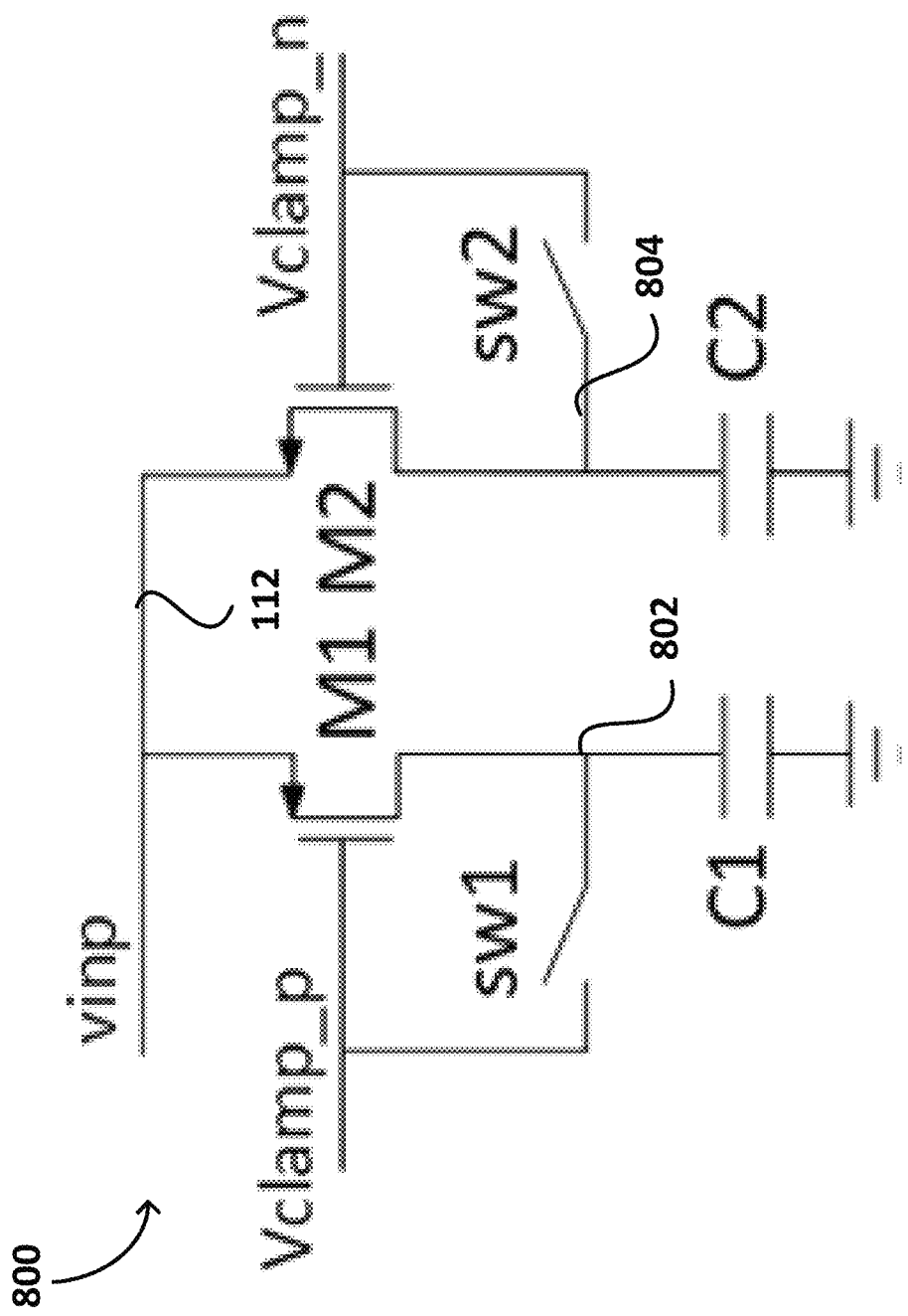
FIG. 8 is a circuit diagram of a charge controlled clamp including first and second transistors.

FIG. 8 shows a different embodiment charge controlled clamping circuit 800 that can be used to realize charge controlled clamp 116 and charge controlled clamp 118 of FIG. 2A, which also provides the charge controlled clamp functionality so that the DC operating point of circuit node 112 can be quickly restored after an overload condition is removed. PMOS transistor M1 provides the function of regulated switch 311 in FIG. 3 for the positive clamp and NMOS transistor M2 provides the function of regulated switch for the negative clamp. Capacitor C1 provides the charge storage function of capacitor 306 in FIG. 3. Capacitor C2 provides the charge storage function for the negative branch. The gate of transistor M1, which is called Vclamp_p in FIG. 8, is connected to a reference voltage source which sets the positive clamping voltage together with the threshold voltage of M1. The gate of transistor M2, which is called Vclamp_n in FIG. 8, is connected to a reference voltage source which sets the negative clamping voltage together with the threshold voltage of M2. In operation, the drain terminal 802 of transistor M1 (also the top plate of C1) is initially pre-charged to Vclamp_p via reset switch sw1. Similarly, the drain terminal 804 of transistor M2 (also the top plate of C2) is initially pre-charged to Vclamp_n via reset switch sw2. When input voltage (vinp) rises beyond Vclamp_p+Vth_M1 (Vth_M1 is the threshold voltage of M1), charge controlled clamping circuit 800 enters the positive overload region, and transistor M1 starts to conduct to store charge on C1, similar to regulated switch 311 in FIG. 3. When input voltage (vinp) starts to fall from its positive peak, charge stored on C1 is returned to MEMS capacitor from input node (vinp). When input voltage (vinp) finally falls below Vclamp_p+Vth_M1, charge controlled clamping circuit 800 returns back to the normal operation region and transistor M1 turns off. When input voltage (vinp) falls below Vclamp_n−Vth_M2 (Vth_M2 is the threshold voltage of M2), charge controlled clamping circuit 800 enters the negative overload region, and a similar procedure described for the positive overload case is repeated.

In an embodiment, transistor M1 and switch sw1 of charge controlled clamping circuit 800 can be replaced by a diode-connected transistor (by replacing switch sw1 with a short circuit) or a diode. Similarly, transistor M2 and switch sw2 of charge controlled clamping circuit 800 can be replaced by a diode-connected transistor (by replacing switch sw2 with a short circuit) or a diode.

Advantages of the readout circuit using charge controlled clamps according to embodiments described herein include improved performance for overload events across the full acoustic frequency band, improved performance for overload events in the infrasonic frequency band as well as DC overdrive events, no impact on performance in the normal signal range and thus no Total Harmonic Distortion (THD) degradation and no Signal to Noise Ratio (SNR) degradation, and desired accuracy of the charge controlling is easily scalable using die area and power. For example, larger capacitors will lead to more charge being stored in the capacitor with respect to the capacitance of the output of the corresponding MEMS device.

Example embodiments of the present invention are summarized here. Other embodiments can also be understood from the entirety of the specification and the claims filed herein.

Example 1. According to an embodiment, a device comprises a readout circuit coupled between an input node and an output node; a microelectromechanical systems (MEMS) device coupled to the input node; and a first charge controlled clamp circuit coupled between the input node and a first bias node.

Example 2. The device of Example 1, wherein the first charge controlled clamp circuit is configured for clamping the input node to a first clamp voltage, storing a first charge available at the input node during an overload condition, and returning the first charge to the input node after the overload condition is removed.

Example 3. The device of claim 1, wherein the first charge controlled clamp circuit comprises a first transistor circuit, or a first diode circuit.

Example 4. The device of any of the previous examples, further comprising a second charge controlled clamp circuit coupled between the input node and a second bias node.

Example 5. The device of any of the previous examples, wherein the second charge controlled clamp circuit is configured for clamping the input node to a second clamp voltage, storing a second charge available at the input node during an overload condition, and returning the second charge to the input node after the overload condition is removed.

Example 6. The device of any of the previous examples, wherein the second charge controlled clamp circuit comprises a second transistor circuit, or a second diode circuit.

Example 7. The device of any of the previous examples, wherein the first charge controlled clamp circuit comprises a first switching circuit coupled to a first capacitor.

Example 8. The device of any of the previous examples, wherein the first switching circuit comprises a first transistor coupled to a first operational amplifier, and wherein an input of the first operational amplifier is coupled to the input node.

Example 9. The device of any of the previous examples, wherein a value of the first capacitor is configured to be greater than a value of a capacitance associated with the MEMS device.

Example 10. The device of any of the previous examples, wherein the first charge controlled clamp circuit further comprises a second switching circuit coupled to the first capacitor.

Example 11. The device of any of the previous examples, wherein the second switching circuit comprises a second transistor coupled to a second operational amplifier, and wherein an input of the second operational amplifier is coupled to the first capacitor.

Example 12. The device of any of the previous examples, further comprising a Schmitt trigger circuit coupled to the first capacitor and the first bias node, configured for operationally controlling the second operational amplifier.

Example 13. The device of any of the previous examples, wherein the readout circuit comprises an amplifier circuit.

Example 14. The device of any of the previous examples, further comprising a bias resistor coupled between the input node and a resistor bias node.

Example 15. According to an embodiment, a clamping circuit comprises a first charge controlled clamp coupled between an input node and a first bias node, the first charge controlled clamp being configured to store a first charge associated with the input node during a first voltage clamping mode and to return the first charge to the input node after the first voltage clamping mode; and a second charge controlled clamp coupled between the input node and a second bias node, the second charge controlled clamp being configured to store a second charge associated with the input node during a second voltage clamping mode and to return the second charge to the input node after the second voltage clamping mode.

Example 16. The clamping circuit of Example 15, wherein the first charge controlled clamp comprises a first switching circuit coupled to a first capacitor, and wherein the second charge controlled clamp comprises a second switching circuit coupled to a second capacitor.

Example 17. The clamping circuit of any of the previous examples, wherein a value of the first capacitor is greater than a capacitance associated with the input node, and wherein a value of the second capacitor is greater than the capacitance associated with the input node.

Example 18. The clamping circuit of any of the previous examples, wherein the first charge controlled clamp comprises a first additional switching circuit coupled to the first capacitor, and wherein the second charge controlled clamp comprises a second additional switching circuit.

Example 19. The clamping circuit of any of the previous examples, wherein the first voltage clamping mode comprises a positive voltage clamping mode, and wherein the second voltage clamping mode comprises a negative clamping mode.

Example 20. According to an embodiment, a method of operating a microelectromechanical systems (MEMS) comprises clamping a node of the MEMS device to a first voltage during a first overload mode of operation; storing a first charge associated with the node of the MEMS device during the first overload mode of operation; and returning the first charge to the node of the MEMS device after the first overload mode of operation.

Example 21. The method of Example 20, further comprising restoring a DC operating point of the MEMS device immediately after returning the first charge to the node of the MEMS device.

Example 22. The method of any of the previous examples, further comprising clamping a node of the MEMS device to a second voltage during a second overload mode of operation; storing a second charge associated with the node of the MEMS device during the second overload mode of operation; and returning the second charge to the node of the MEMS device after the first overload mode of operation.

Example 23. The method of any of the previous examples, further comprising restoring a DC operating point of the MEMS device immediately after returning the second charge to the node of the MEMS device.

Example 24. The method of any of the previous examples, wherein the first overload mode of operation comprises an AC overload mode of operation or a DC overload mode of operation.

Example 25. According to an embodiment, a circuit comprises a first capacitor; a first transistor having a load path coupled between the first capacitor and a clamping node; and a first amplifier having a negative input coupled to the clamping node, a positive input coupled to a first clamping voltage reference node, and an output coupled to a control node of the first transistor.

Example 26. The circuit of Example 25, further comprising a second transistor having a load path coupled between the first capacitor and the clamping node; and a second amplifier having a negative input coupled to the first capacitor, a positive input coupled to the first clamping voltage reference node, and an output coupled to a control node of the second transistor.

Example 27. The circuit of any of the previous examples, further comprising a Schmitt trigger having an input coupled to the clamping node configured for operationally controlling the second amplifier.

Example 28. The circuit of any of the previous examples, further comprising a microelectromechanical (MEMS) device having an output coupled to the clamping node.

Example 29. The circuit of any of the previous examples, further comprising a second capacitor; a third transistor having a load path coupled between the second capacitor and the clamping node; and a third amplifier having a negative input coupled to the clamping node, a positive input coupled to a second clamping voltage reference node, and an output coupled to a control node of the third transistor.

Example 30. The circuit of any of the previous examples, further comprising a fourth transistor having a load path coupled between the second capacitor and the clamping node; and a fourth amplifier having a negative input coupled to the second capacitor, a positive input coupled to the second clamping voltage reference node, and an output coupled to a control node of the fourth transistor.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A device comprising:
a readout circuit coupled between an input node and an output node;
a microelectromechanical systems (MEMS) device coupled to the input node; and
a first charge controlled clamp circuit coupled to the input node, wherein the first charge controlled clamp circuit is configured for clamping the input node to a first clamp voltage, storing a first charge available at the input node during an overload condition, and returning the first charge to the input node after the overload condition is removed.

2. The device of claim 1, wherein the first charge controlled clamp circuit comprises a first transistor circuit, or a first diode circuit.

3. The device of claim 1, further comprising a second charge controlled clamp circuit coupled to the input node.

4. The device of claim 3, wherein the second charge controlled clamp circuit is configured for clamping the input node to a second clamp voltage, storing a second charge available at the input node during an overload condition, and returning the second charge to the input node after the overload condition is removed.

5. The device of claim 3, wherein the second charge controlled clamp circuit comprises a second transistor circuit, or a second diode circuit.

6. The device of claim 1, wherein the first charge controlled clamp circuit comprises a first switching circuit coupled to a first capacitor.

7. The device of claim 6, wherein the first switching circuit comprises a first transistor coupled to a first operational amplifier, and wherein an input of the first operational amplifier is coupled to the input node.

8. The device of claim 6, wherein a value of the first capacitor is configured to be greater than a value of a capacitance associated with the MEMS device.

9. The device of claim 6, wherein the first charge controlled clamp circuit further comprises a second switching circuit coupled to the first capacitor.

10. The device of claim 9, wherein the second switching circuit comprises a second transistor coupled to a second operational amplifier, and wherein an input of the second operational amplifier is coupled to the first capacitor.

11. The device of claim 10, further comprising a Schmitt trigger circuit coupled to the first capacitor, and configured for operationally controlling the second operational amplifier.

12. The device of claim 1, wherein the readout circuit comprises an amplifier circuit.

13. The device of claim 1, further comprising a bias resistor coupled to the input node.

14. A method of operating a microelectromechanical systems (MEMS) device, the method comprising:
clamping a node of the MEMS device to a first voltage during a first overload mode of operation;
storing a first charge associated with the node of the MEMS device during the first overload mode of operation; and
returning the first charge to the node of the MEMS device after the first overload mode of operation.

15. The method of claim 14, further comprising restoring a DC operating point of the MEMS device immediately after returning the first charge to the node of the MEMS device.

16. The method of claim 14, further comprising:
clamping a node of the MEMS device to a second voltage during a second overload mode of operation;
storing a second charge associated with the node of the MEMS device during the second overload mode of operation; and
returning the second charge to the node of the MEMS device after the first overload mode of operation.

17. The method of claim 16, further comprising restoring a DC operating point of the MEMS device immediately after returning the second charge to the node of the MEMS device.

18. The method of claim 14, wherein the first overload mode of operation comprises an AC overload mode of operation or a DC overload mode of operation.

* * * * *